Oct. 20, 1970 TOKINORI KOZAWA ET AL 3,535,647

TRANSISTOR A.C. AMPLIFIER CIRCUIT

Filed Dec. 15, 1967 3 Sheets-Sheet 1

INVENTORS
TOKINORI KOZAWA, YOSHITO COMURA, ICHIRO MIWA, MINORU NAGATA

BY Craig & Antonelli

ATTORNEYS

INVENTORS
TOKINORI KOZAWA, YOSHITO OOMURA,
ICHIRO MIWA, MINORU NAGATA

BY Craig & Antonelli
ATTORNEYS

INVENTORS
TOKINORI KOZAWA, YOSHITO OOMURA, ICHIRO NIWA, MINORU NAGATA

BY Craig & Antonelli
ATTORNEYS

United States Patent Office 3,535,647

Patented Oct. 20, 1970

3,535,647

TRANSISTOR A.C. AMPLIFIER CIRCUIT

Tokinori Kozawa, Kokubunji-shi, Yoshita Oomura, Hachioji-shi, Ichiro Miwa, Tokyo, and Minoru Nagata, Kodaira-shi, Japan, assignors to Hitachi, Ltd., Tokyo, Japan, a corporation of Japan Filed Dec. 15, 1967, Ser. No. 690,851

Int. Cl. H03f 3/42

U.S. Cl. 330—18 10 Claims

ABSTRACT OF THE DISCLOSURE

A common emitter type first transistor for amplifying an A.C. input signal superimposed on a D.C. voltage the D.C. potential of which is fluctuant, has an emitter connected to the collector of a second transistor operated under a constant voltage drive by supplying a constant voltage between the base and the emitter thereof to allow a constant current to flow through the collector thereof and the emitter of the first transistor. This emitter of the first transistor is A.C. grounded through a capacitor so that said first transistor amplifies the A.C. input signal with D.C. potential of an output signal thereof regardless of the fluctuation of the D.C. potential superimposed on the A.C. input signal.

This invention relates to a transistor A.C. amplifier circuit, and more particularly to an improved transistor A.C. amplifier circuit in which even if the D.C. potential of an input signal applied thereto varies, its output D.C. potential is kept stable so that in case that it is in direct-coupled cascade connection with another transistor A.C. amplifying circuit, it facilitates the D.C. operating potential of the following stage circuits to be maintained in its stable state.

When a high gain transistor A.C. amplifier is formed of a cascade connection of transistors by using recently progressed semiconductor integrated circuit techniques, it is advantageous to form a direct-coupled type of circuit without any coupling means such as, for example, a capacitor and a transformer. This is because the formation of an inductance element in a semiconductor integrated circuit is constructionally difficult and because a capacitor having a high capacitance is considerably difficult to obtain through it is not necessarily impossible to form a capacitor in an integrated circuit. Further, a semiconductor integrated capacitor has necessarily a parasitic capacitance against the earth because of its construction so that one terminal thereof becomes equivalently grounded. Therefore, a capacitor obtained in an integrated circuit is not practical except for particular usages, e.g., a bypass capacitor and a circuit requiring no high capacitance.

However, since direct-coupled transistor A.C. amplifiers in cascade connection have the same D.C. and A.C. gains, when the D.C. bias voltage in a preceding amplifying stage is varied, the variation in the D.C. bias voltage is amplified together with an A.C. input signal superimposed thereon and makes the D.C. operating point of the following stage circuits vary remarkably. Especially, in case of a high gain amplifier circuit, even a small variation of the bias voltage in a preceding circuit causes saturation or cut-off in the following stage circuits, thus a normal amplification is made impossible. This is an essential defect of this type of amplifier.

Also, in a usual amplifier circuit an input signal may be considered to be only an A.C. signal while in an oscillator or an active gain control circuit the output signal becomes an A.C. signal superimposed on the variation of a D.C. bias voltage as the D.C. operating point necessarily varies in operation. Hence, if the output signal of such a circuit is supplied to a direct-coupled amplifier of cascade connection, no effective amplification is expected because of the variation of the operating point of the following stage amplifiers.

Although a direct-coupled cascade amplifier has a structure extremely suitable for a semiconductor integrated circuit, the usage has been limited to a particular case such as a D.C. amplifier owing to its functional defects.

Therefore, an object of this invention is to provide a transistor A.C. amplifier circuit extremely suitable for semiconductor integrated circuit configuration.

Another object of this invention is to provide a direct-coupled transistor A.C. amplifier circuit which operatively amplifies an A.C. input signal accompanied with a fluctuating D.C. potential.

A further object of this invention is to provide a transistor A.C. amplifier circuit suitable for a semiconductor integrated circuit specifically in combination with a gain control circuit.

Still another object of this invention is to provide a transistor A.C. amplifier circuit in direct-coupled multistage cascade connection suitable for obtaining a high gain.

A transistor A.C. amplifier circuit according to this invention attaining the above-mentioned objects, is comprised of an amplifying transistor for amplifying an A.C. input signal applied to the base thereof, the emitter of which is connected to the collector of a driving transistor operating as constant current circuit means. The emitter of the driving transistor is grounded directly and the emitter of the amplifying transistor is grounded through a capacitor. The amplifying transistor is driven by a constant current from the driving transistor which is operated by a constant voltage supplied between the base and the emitter thereof. Thus, the A.C. input signal applied to the base of the amplifying transistor appears amplified at the collector thereof.

Above-mentioned and other objects, composition and features of this invention will be made more apparent by the following detailed explanation with reference to the accompanying drawings, in which:

FIG. 2(*b*) shows a component in said constant current circuit;

Figure 1:
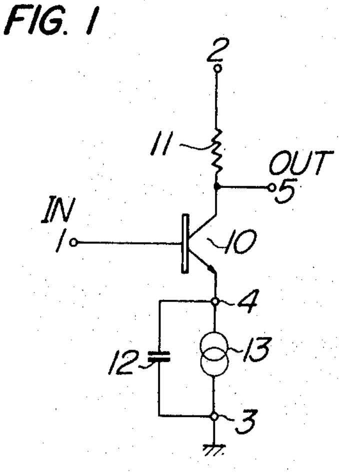
FIG. 1 shows the principle of a transistor A.C. amplifier circuit according to this invention.

This invention essentially relates to a common emitter type A.C. amplifier, the basic principle being shown in FIG. 1. An A.C. input signal is applied to an input terminal 1 connected to the base of a transistor 10. The collector of the transistor 10 is connected to a positive voltage source 2 through a load resistor 11. The emitter of the transistor 10 is grounded through a grounding capacitor 12. A constant current circuit 13 giving a constant current drive to the transistor 10 is provided between the emitter of the transistor 10 and the earth point 3. The A.C. input signal applied to the input terminal 1 appears amplified at the collector of the transistor 10 and is derived from an output terminal 5. The constant current circuit 13 may be selected from various known circuits as shown in FIGS. 2(*a*) and 3.

Figure 2A:
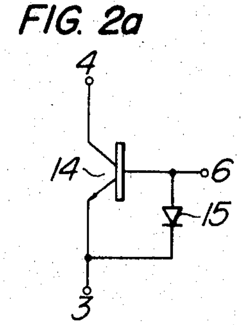
FIG. 2(*a*) shows one example of a constant current circuit used in the circuit of this invention.
Figure 2B:
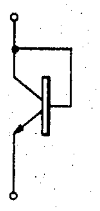

FIG. 2(*a*) shows a constant current circuit, in which a diode 15 is connected between the base and the emitter of a transistor 14. When an appropriate voltage is given to a base terminal 6, a constant voltage appears between the base and the emitter, so that a constant current flows through the collector circuit. The terminal 4 of the collector is connected to the emitter of the transistor 10 as shown in the amplifier circuit of FIG. 1. In the case of a semiconductor integrated circuit, the diode 15 may be replaced by a two-terminal element obtained by short-circuiting the base and the collector of a transistor as shown in FIG. 2(*b*).

Figure 3:
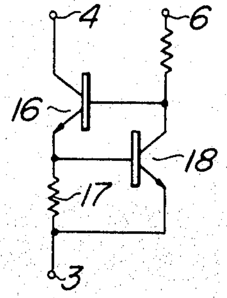
FIG. 3 shows another example of a constant current circuit used in the circuit of this invention.

The constant current circuit shown in FIG. 3 consists of transistors 16 and 18. The transistor 18 amplifies the potential variation appearing across a resistor 17 connected to the emitter of the transistor 16 and feeds it back to the transistor 16. The base of the transistor 16 is connected to a suitable potential point 6 so that a constant current is supplied through the collector of the transistor 16.

The characteristic of the amplifier circuit of this invention is that an A.C. amplifying transistor is driven by a driving circuit which comprises a driving transistor and a grounding capacitor connecting the collector of said driving transistor with ground, said driving transistor having its collector coupled with the emitter of said amplifying transistor and supplied with a constant voltage between the base and the emitter thereof to provide a constant current to the emitter-collector circuit of said amplifying transistor. As a result, the A.C. amplification is effected in such a way that the D.C. potential of the output terminal 5 is kept constant regardless of the D.C. level variation of the input signal.

Figure 4:
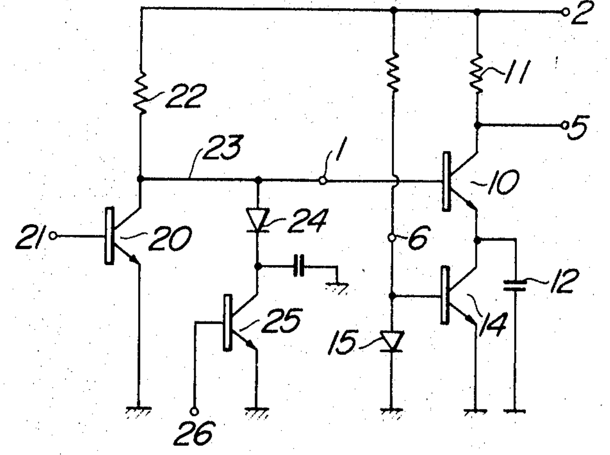
FIG. 4 shows a circuit of this invention in one practical example.

FIG. 4 shows an A.C. amplifier circuit of this invention in combination with an automatic gain control circuit (hereinafter referred to as AGC circuit), using the constant current circuit shown in FIG. 2*a* to give a constant current drive to the transistor 10. 20 shows a first stage transistor in common emitter configuration and 22 shows a collector load resistor. An A.C. signal applied at the base 21 of the transistor 20 is amplified by this transistor 20 and introduced to the amplifier circuit of this invention through the line 23 connecting directly the collector of the transistor 20 with the base of the transistor 10 where like reference numerals are used to denote like parts as shown in FIG. 1. An AGC circuit comprised of a diode 24 and a transistor 25 lies between the line 23 and the earth in parallel with the transistor 20. An AGC signal is applied at the base 26 of the transistor 25 to control the bias current through the diode 24, which therefore acts as a variable impedance element. A diode 24 and the resistor 22 determine the load impedance of the first stage amplifying transistor 20 and controls its output in accordance with the impedance variation of diode 24. The AGC signal changes the current flowing through the diode 24, followed by a D.C. potential variation of the output signal of the transistor 20. The signal applied to the base of the second stage transistor 10, therefore, would suffer a D.C. potential variation unless the present invention is adopted.

Now consider that the method of this invention is employed in this circuit. The emitter of the second stage transistor 10 is driven by a constant current circuit and grounded through a capacitor 12. The D.C. current flowing through the collector becomes, therefore, always constant regardless of the D.C. potential variation of the base. Consequently, the output signal appearing at the terminal 5 has a constant D.C. potential, only an amplified A.C. signal being obtained. As long as the base potential $V_B$ of transistor 10 is within the following range, the transistor 10 makes a normal amplification, showing neither saturation nor cut-off.

$$V_0 - V_{S10} + V_{BE10} > V_B > V_{S14} + V_{BE10} \qquad (1)$$

Here $V_{S10}$ and $V_{S14}$ are the collector saturation voltages of the transistors 10 and 14 respectively, $V_{BE10}$ is the voltage between the base and the emitter of the transistor 10, and $V_0$ is the collector D.C. potential of the transistor 10.

As the collector D.C. potential $V_0$ is given by $$V_0 = V_{cc} - I_c \cdot R_c \qquad (2)$$

where $I_c$ is the collector D.C. current of transistor 10, $V_{cc}$ is the collector supply voltage and $R_c$ is the resistance of the collector load resistor 11, the D.C. output potential appearing at the output terminal 5 can be arbitrarily controlled by the collector supply voltage $V_{cc}$.

The above circuit includes the capacitor 12 and it is for grounding the emitter of the transistor 10. So, it is easy to form such capacitor in a semiconductor integrated circuit.

Figure 5:
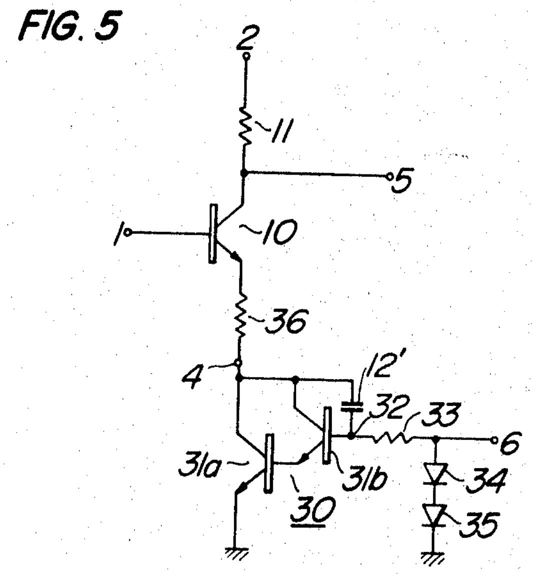
FIG. 5 shows one example of a circuit of this invention specifically suitable for the semiconductor integrated circuit configuration.

FIG. 5 shows an example where a capacitor 12′ of smaller capacitance has a function equivalent to that of the above described capacitor 12. In this circuit the constant current transistor circuit 30 consists of transistors **31*a* and 31*b* which are mutally connected in so-called Darlington connection to increase both the current gain $h_{fe}$ and the input impedance. A resistor 33 is inserted in the base of the transistor 31*b* to increase the equivalent base resistance of the transistor circuit 30. The base terminal 32 is connected to one end of a grounding capacitor 12′ the other end of which is connected to the emitter of the transistor 10 through a resistor 36. Diodes 34 and 35 are provided to give a constant voltage drive between the base and the emitter of the transistor circuit 30. The transistor circuit 30 of this structure performs the capacitor multiplication like a known reactance transistor circuit. As a result, the equivalent capacitance of the capacitor 12′ seen from the emitter of the amplifying transistor 10 becomes about $h_{fe}$ times the self-capacitance $C'_{12}$ of the capacitor 12′. So the capacitance value $C'_{12}$ may be small even if a larger capacity is required for the transistor 10. The resistor 36 connected in series with the emitter circuit of the amplifying transistor 10 changes the $I_c - V_B$ characteristic of the transistor 10** and extends the dynamic range thereof.

Figure 6:
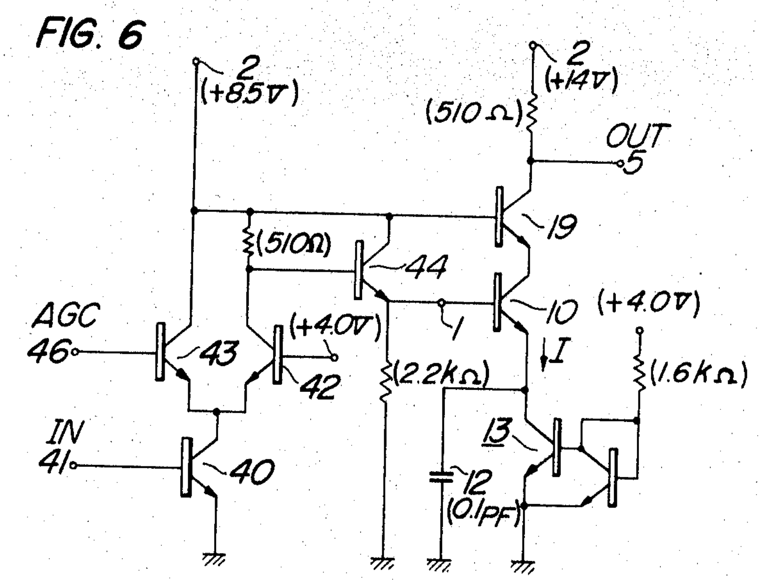
FIG. 6 shows a circuit in one embodiment of this invention examining concrete effects thereof.
Figure 7:
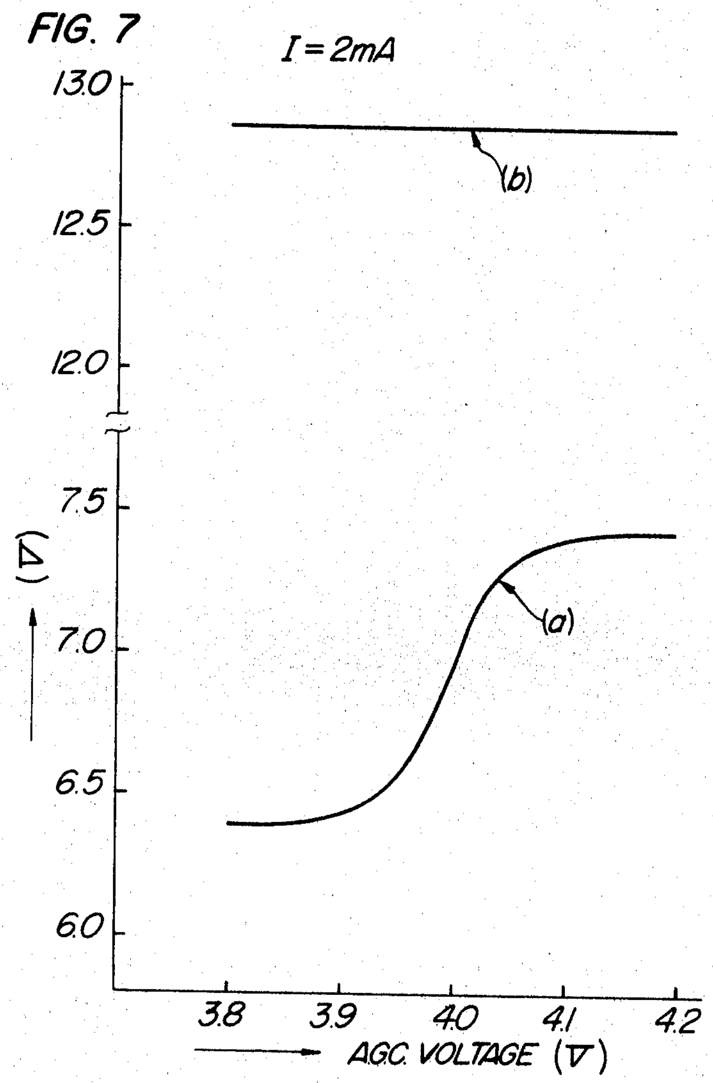
FIG. 7 shows results of measurement obtained in the circuit of the above embodiment.

Next a concrete effect of this invention will be explained with reference to FIGS. 6 and 7 showing the experimental circuit and results. An experiment was made to see whether a signal having an extremely varying D.C. potential due to a preceding stage, e.g., a differential type AGC circuit, when applied to the invention transistor amplifier circuit 10, is amplified in such a manner that the D.C. potential of the amplified signal is extremely stabilized.

In the circuit of FIG. 6 a signal applied to an input terminal 41 is amplified by transistors 40 and 42, the latter being connected in cascade with the former. An output signal from the transistor 42 is further amplified by an emitter follower transistor 44 and enters the inventive transistor circuit 10. Passing through a transistor 19 which is in cascade connection with the transistor 10, the final output signal appears at the output terminal 5. 13 shows a constant current circuit and 12 shows the same grounding capacitor as shown before in FIG. 1. The collector of the transistor 40 is also in cascade connection with another transistor 43 in parallel with the transistor 42. An AGC signal is applied to the base of the transistor 43. A portion of the signal current amplified by the transistor 40 flows through the transistor 43, the remaining portion flowing toward the succeeding circuit 44 through the transistor 42. Since the ratio of signal currents flowing through the transistors 42 and 43 is determined by the impedance of each transistor, a change in the impedance of the transistor 43 due to an AGC signal changes this ratio. Hence, the magnitude of the signal transmitted to the succeeding circuit stage 44 through the transistor 42 can be automatically controlled. However, the AGC signal changing the impedance as described above also changes the D.C. bias current flowing through the transistor 42 as well as the A.C. signal. So the input D.C. potential of the transistor 10 varies with the AGC operation. The characteristic curve labeled (*a*) in FIG. 7 shows the D.C. potential variation at the point 1 of the transistor circuit 10 versus the AGC voltage. The measurement was done when the circuit constants were chosen as shown in FIG. 6.

The characteristic curve labeled (*b*), in FIG. 7 which shows the D.C. potential variation of signal at the output terminal 5 amplified by the transistor circuit 10, is almost flat in spite of the considerable potential variation at the input. This exhibits a striking effect of the circuit comprising the invention.

As is evident from the above-mentioned fact, it is apparent that when the inventive transistor circuit is properly used in a direct-coupled A.C. amplifier circuit, the D.C. potential variation of the preceding stage circuit is not transmitted to the following circuits, only an amplified A.C. signal being transmitted. This effect is equally obtained when the inventive circuit is used either in an AGC type circuit or in a customary A.C. amplifier circuit having the same possibility of D.C. potential variation due to the variation in source voltage or temperature.

The provision of a direct-coupled A.C. amplifier circuit using no coupling capacitor is extremely effective in the technique of linear type semiconductor integrated circuits.

What is claimed is:

1. A transistor A.C. amplifier circuit for amplifying an A.C. signal superimposed on a fluctuating D.C. voltage comprising:

an amplifying transistor having a base, emitter and collector for amplifying an A.C. signal applied to its base;

a load impedance connected with the collector of said amplifying transistor so that an output signal is derived from the collector of said amplifying transistor; and driving circuit means connected with the emitter of said amplifying transistor, said driving circuit means including a driving transistor having a base, emitter and collector, the collector of the driving transistor being coupled with the emitter of said amplifying transistor, means for supplying a constant voltage between the base and the emitter of the driving transistor to provide a constant current to the emitter-collector circuit of said amplifying transistor, and a grounding capacitor coupled between the collector of said driving transistor and ground whereby an amplified A.C. output signal with a stabilized D.C. potential is obtained.

2. A transistor A.C. amplifier circuit according to claim 1, further comprising an emitter resistor connected between the emitter of said amplifying transistor and said driving circuit means to control the dynamic range of the amplifier circuit.

3. A transistor A.C. amplifying circuit according to claim 1, wherein said driving circuit means further includes a second driving transistor having a base, emitter and collector connected in a Darlington configuration with said first driving transistor in such a manner that the collectors of said first and second driving transistors are coupled in common with the emitter or said amplifying transistor, the emitter of the first driving transistor is grounded, the base of said first driving transistor is coupled with the emitter of said second driving transistor and the base of said second driving transistor is supplied through a base resistor with a constant bias voltage;

and wherein said grounding capacitor is connected between the collector of said first driving transistor and the base of said second driving transistor.

4. A transistor A.C. amplifier circuit according to claim 3 further comprising an emitter resistor connected between the emitter of said amplifying transistor and said driving circuit means to control the dynamic range of the amplifier circuit.

5. A transistor A.C. amplifier circuit comprising an amplifying transistor in a common emitter configuration having a base, emitter and collector for amplifying an A.C. signal supplied to the base thereof; a load impedance connected with the collector of said amplifying transistor so that an output signal can be derived from the collector of said amplifying transistor; and a constant current source connected with the emitter of said amplifying transistor, said constant current source including a driving transistor having control, supply and output electrodes with the output electrode of the driving transistor being coupled to the emitter of said amplifying transistor, means for supplying a constant voltage between the control and the current electrodes of the driving transistor to produce a constant current through the amplifying transistor, and a grounding capacitor connected between the output electrode of the driving transistor and ground whereby an amplified A.C. output signal with a stabilized D.C. potential is obtained.

6. A transistor A.C. amplifier circuit according to claim 5, further comprising a resistor connected between the emitter of the amplifying transistor and the output electrode of the driving transistor for improving the dynamic range of the amplifier circuit.

7. A transistor A.C. amplifier circuit according to claim 5 wherein the circuit comprises first and second stages with the first stage comprising an AGC circuit having a variable D.C., output potential that is directly connected to the input of the second stage, and the second stage is comprised of said amplifying transistor and interconnected driving circuit means.

8. A transistor A.C. amplifier circuit as defined in claim 5, wherein said constant current source further includes a second driving transistor having control, supply and output electrodes connected in a Darlington configuration with said first driving transistor in such a manner that their output electrodes are coupled in common with the emitter of the amplifying transistor, the supply electrode of said first driving transistor is grounded, the control electrode of said first driving transistor is coupled with the supply electrode of said second driving transistor and the control electrode of said second driving transistor is supplied through a resistor with a constant bias voltage; and wherein said grounding capacitor is connected between the output electrode of said first driving transistor and the control electrode of said second driving transistor.

9. A transistor A.C. amplifier circuit according to claim 8 wherein the circuit comprises first and second stages with the first stage comprising an AGC circuit having a variable D.C. output potential that is directly connected to the input of the second stage, and the second stage is comprised of said amplifying transistor and interconnected driving circuit means.

10. A transistor A.C. amplifier circuit according to claim 9 further comprising a resistor connected between the emitter of the amplifying transistor and the output electrode of the driving transistors for improving the dynamic range of the amplifier circuit.

References Cited

UNITED STATES PATENTS

| | | | |
|---|---|---|---|
| 3,214,706 | 10/1965 | Mollinga | 330—40 X |
| 3,310,731 | 3/1967 | Ostroff et al. | 330—18 |
| 2,762,875 | 9/1956 | Fischer | 330—21 X |
| 3,444,393 | 5/1959 | Sassler | 307—313 X |

ROY LAKE, Primary Examiner

L. J. DAHL, Assistant Examiner

U.S. Cl. X.R.

330—22

UNITED STATES PATENT OFFICE
CERTIFICATE OF CORRECTION

Patent No. 3,535,647 October 20, 1970

Tokinori Kozawa et al.

It is certified that error appears in the above identified patent and that said Letters Patent are hereby corrected as shown below:

In the heading to the printed specification, after line 7, insert -- Claims priority application Japan Dec. 28, 1966 41/85339 --.

Signed and sealed this 6th day of April 1971.

(SEAL)
Attest:

EDWARD M.FLETCHER,JR.
Attesting Officer

WILLIAM E. SCHUYLER, JR.
Commissioner of Patents

UNITED STATES PATENT OFFICE
CERTIFICATE OF CORRECTION

Patent No. 3,535,647 Dated October 20, 1970

Inventor(s) Tokinori Kozawa, Yoshito Oomura, Ichiro Miwa and Minoru Nagata

It is certified that error appears in the above-identified patent and that said Letters Patent are hereby corrected as shown below:

Page 1, column 1, Yoshita Oomura should read -- Yoshito Oomura --

Signed and sealed this 14th day of December 1971.

(SEAL)
Attest:

EDWARD M.FLETCHER,JR.
Attesting Officer

ROBERT GOTTSCHALK
Acting Commissioner of Patents